(12) United States Patent
Wang et al.

(10) Patent No.: US 11,315,635 B2
(45) Date of Patent: Apr. 26, 2022

(54) SPLIT-GATE, 2-BIT NON-VOLATILE MEMORY CELL WITH ERASE GATE DISPOSED OVER WORD LINE GATE, AND METHOD OF MAKING SAME

(71) Applicant: Silicon Storage Technology, Inc., San Jose, CA (US)

(72) Inventors: Chunming Wang, Shanghai (CN); Xian Liu, Sunnyvale, CA (US); Guo Xiang Song, Shanghai (CN); Leo Xing, Shanghai (CN); Nhan Do, Saratoga, CA (US)

(73) Assignee: Silicon Storage Technology, Inc., San Jose, CA (US)

( * ) Notice: Subject to any disclaimer, the term of this patent is extended or adjusted under 35 U.S.C. 154(b) by 0 days.

(21) Appl. No.: 17/152,696

(22) Filed: Jan. 19, 2021

(65) Prior Publication Data

US 2022/0101920 A1 Mar. 31, 2022

(30) Foreign Application Priority Data

Sep. 30, 2020 (CN) .......................... 202011056431.1

(51) Int. Cl.
*G11C 16/04* (2006.01)
*G11C 16/16* (2006.01)
(Continued)

(52) U.S. Cl.
CPC .......... *G11C 16/0458* (2013.01); *G11C 16/16* (2013.01); *H01L 27/11521* (2013.01); *H01L 27/11556* (2013.01); *H01L 29/42328* (2013.01)

(58) Field of Classification Search
CPC ................ G11C 16/0458; G11C 16/16; H01L 27/11521; H01L 27/11556; H01L 29/42328
See application file for complete search history.

(56) References Cited

U.S. PATENT DOCUMENTS 6,646,914 B1 11/2003 Haddad
6,747,310 B2 6/2004 Fan et al.
(Continued)

FOREIGN PATENT DOCUMENTS

CN 106206588 A 12/2016
JP H07-508859 A 9/1995
(Continued)

OTHER PUBLICATIONS

PCT Search Report and Written Opinion dated May 26, 2021 from the related PCT Patent Application No. US2021/014246.

*Primary Examiner* — Tri M Hoang
(74) *Attorney, Agent, or Firm* — DLA Piper LLP (US)

(57) ABSTRACT

A memory device includes a semiconductor substrate, first and second regions in the substrate having a conductivity type different than that of the substrate, with a channel region in the substrate extending between the first and second regions. The channel region is continuous between the first and second regions. A first floating gate is disposed over and insulated from a first portion of the channel region. A second floating gate is disposed over and insulated from a second portion of the channel region. A first coupling gate is disposed over and insulated from the first floating gate. A second coupling gate is disposed over and insulated from the second floating gate. A word line gate is disposed over and insulated from a third portion of the channel region between the first and second channel region portions. An erase gate is disposed over and insulated from the word line gate.

13 Claims, 15 Drawing Sheets

(51) Int. Cl.
  *H01L 27/11556*  (2017.01)
  *H01L 27/11521*  (2017.01)
  *H01L 29/423*   (2006.01)

(56) References Cited

U.S. PATENT DOCUMENTS

| | | |
|---|---|---|
| 7,046,552 B2 | 5/2006 | Chen et al. |
| 7,718,488 B2 | 5/2010 | Chen et al. |
| 7,868,275 B2 | 1/2011 | Liu et al. |
| 8,325,521 B2 | 12/2012 | Hsieh |
| 8,780,625 B2 | 7/2014 | Gu et al. |
| 9,972,632 B2 | 5/2018 | Wang et al. |
| 10,658,027 B2 | 5/2020 | Do et al. |
| 2002/0109138 A1 | 8/2002 | Forbes |
| 2003/0146465 A1 | 8/2003 | Wu |
| 2003/0209751 A1 | 11/2003 | Harari |
| 2005/0012137 A1 | 1/2005 | Levi |
| 2005/0024961 A1 | 2/2005 | Ding |
| 2008/0049517 A1 | 2/2008 | Hung et al. |
| 2008/0123416 A1 | 5/2008 | Chih |
| 2009/0108328 A1 | 4/2009 | Widjaja |
| 2010/0008141 A1 | 1/2010 | Chu |
| 2012/0206969 A1 | 8/2012 | Gu et al. |
| 2014/0126299 A1 | 5/2014 | Fukumoto |
| 2014/0151782 A1 | 6/2014 | Tsair et al. |
| 2014/0203343 A1 | 7/2014 | Wang |
| 2016/0133639 A1 | 5/2016 | Tran et al. |
| 2017/0012049 A1 | 1/2017 | Yang |
| 2019/0172529 A1 | 6/2019 | Do et al. |
| 2020/0176460 A1* | 6/2020 | Decobert ............... G11C 16/26 |

FOREIGN PATENT DOCUMENTS

| | | |
|---|---|---|
| JP | H08-83855 A | 3/1996 |
| JP | 2013 222201 | 11/2012 |
| JP | 2014 096421 | 5/2014 |
| KR | 10-2009-0106573 | 10/2009 |
| KR | 10-2014-0057582 A | 5/2014 |
| TW | 200802816 | 1/2008 |
| WO | 2014 051855 | 4/2014 |

* cited by examiner

SPLIT-GATE, 2-BIT NON-VOLATILE MEMORY CELL WITH ERASE GATE DISPOSED OVER WORD LINE GATE, AND METHOD OF MAKING SAME

PRIORITY CLAIM

This patent application claims priority to Chinese Patent Application No. 202011056431.1, filed on Sep. 30, 2020, entitled "Split-Gate, 2-Bit Non-volatile Memory Cell With Erase Gate Disposed Over Word Line Gate, And Method Of Making Same."

FIELD OF THE INVENTION

The present invention relates to non-volatile memory arrays, and more particularly to a split gate, 2-bit memory cell having multiple floating and coupling gates, a word line gate and an erase gate.

BACKGROUND OF THE INVENTION

Split gate non-volatile flash memory cells are well known. For example, U.S. Pat. No. 6,747,310 discloses such memory cells having source and drain regions defining a channel region there between, a select gate over one portion of the channel regions, a floating gate over the other portion of the channel region, and an erase gate over the source region. The memory cells are formed in pairs that share a common source region and common erase gate, with each memory cell having its own channel region in the substrate extending between the source and drain regions (i.e. there are two separate channel regions for each pair of memory cells). The lines connecting all the control gates for memory cells in a given column run vertically. The same is true for the lines connecting the erase gates and the select gates, and the source lines. The bit lines connecting drain regions for each row of memory cells run horizontally.

Each memory cell stores a single bit of information (based on the programming state of the floating gate). Given the number of electrodes for each cell (source, drain, select gate, control gate and erase gate), and two separate channel regions for each pair of memory calls, configuring and forming the architecture and array layout with all the various lines connected to these electrodes can be overly complex and difficult to implement, especially as critical dimensions continue to shrink.

One solution is to eliminate the source region, and have both memory cells share a single continuous channel region and a common word line gate, and disclosed in U.S. Pat. No. 8,780,625. However, there are performance limitations with this configuration because, among other things, it lacks erase gates. U.S. Pat. No. 10,658,027 discloses a single continuous channel region and a common erase gate, but lacks any word line gates positioned to control the conductivity of portions of the channel region. U.S. Pat. No. 9,972,632 discloses a single continuous channel region with a common word line gate and erase gates. However, this configuration is not ideal because erase efficiency can be compromised by the high coupling ratio to the drain region and the lack of a geometry that enhances erase tunneling efficiency.

BRIEF SUMMARY OF THE INVENTION

The aforementioned problems and needs are addressed by a memory device that includes a substrate of semiconductor material of a first conductivity type, first and second regions spaced apart in the substrate and having a second conductivity type different than the first conductivity type, with a channel region in the substrate extending between the first and second regions, wherein the channel region is continuous between the first and second regions, a first floating gate disposed over and insulated from a first portion of the channel region adjacent to the first region, a second floating gate disposed over and insulated from a second portion of the channel region adjacent to the second region, a first coupling gate disposed over and insulated from the first floating gate, a second coupling gate disposed over and insulated from the second floating gate, a word line gate disposed over and insulated from a third portion of the channel region between the first and second channel region portions, and an erase gate disposed over and insulated from the word line gate.

A method of forming a memory cell includes forming a first insulation layer on a semiconductor substrate having a first conductivity type; forming a first conductive layer on the first insulation layer; forming a second insulation layer on the first conductive layer; forming a second conductive layer on the second insulation layer; forming a third insulation layer on the second conductive layer; forming a trench that extends through the third insulation layer, the second conductive layer, and the second insulation layer; forming insulation spacers along a sidewall of the trench; extending the trench through the first conductive layer between the insulation spacers; forming a word line gate in the trench, wherein the word line gate is disposed vertically over and insulated from the substrate; forming an erase gate in the trench, wherein the erase gate is disposed vertically over and insulated from the word line gate; removing portions of the second conductive layer while maintaining first and second portions of the second conductive layer as respective first and second coupling gates, and removing portions of the first conductive layer while maintaining first and second portions of the first conductive layer as respective first and second floating gates; and forming first and second regions in the substrate and having a second conductivity type different than the first conductivity type, wherein the first region is adjacent to the first floating gate and the second region is adjacent to the second floating gate, and wherein a continuous channel region in the substrate extends between the first and second regions. The first floating gate is disposed over and insulated from the substrate and laterally adjacent to and insulated from the word line gate. The second floating gate is disposed over and insulated from the substrate and laterally adjacent to and insulated from the word line gate. The first coupling gate is disposed over and insulated from the first floating gate. The second coupling gate is disposed over and insulated from the second floating gate.

A method of forming a memory cell, includes forming a first insulation layer on a semiconductor substrate having a first conductivity type; forming a first conductive layer on the first insulation layer; forming a second insulation layer on the first conductive layer; forming a second conductive layer on the second insulation layer; forming a third insulation layer on the second conductive layer; removing portions of the second conductive layer while maintaining first and second portions of the second conductive layer as respective first and second coupling gates, and removing portions of the first conductive layer while maintaining first and second portions of the first conductive layer as respective first and second floating gates; forming a word line gate that is disposed vertically over and insulated from the substrate and disposed laterally between the first and second floating gates; forming an erase gate that is disposed vertically over and insulated from the word line gate and disposed laterally between the first and second coupling gates; and forming first and second regions in the substrate and having a second conductivity type different than the first conductivity type, wherein the first region is adjacent to the first floating gate and the second region is adjacent to the second floating gate, and wherein a continuous channel region in the substrate extends between the first and second regions. The first floating gate is disposed over and insulated from the substrate. The second floating gate is disposed over and insulated from the substrate. The first coupling gate is disposed over and insulated from the first floating gate. The second coupling gate is disposed over and insulated from the second floating gate.

Other objects and features of the present invention will become apparent by a review of the specification, claims and appended figures.

DETAILED DESCRIPTION OF THE INVENTION

Figure 1A:
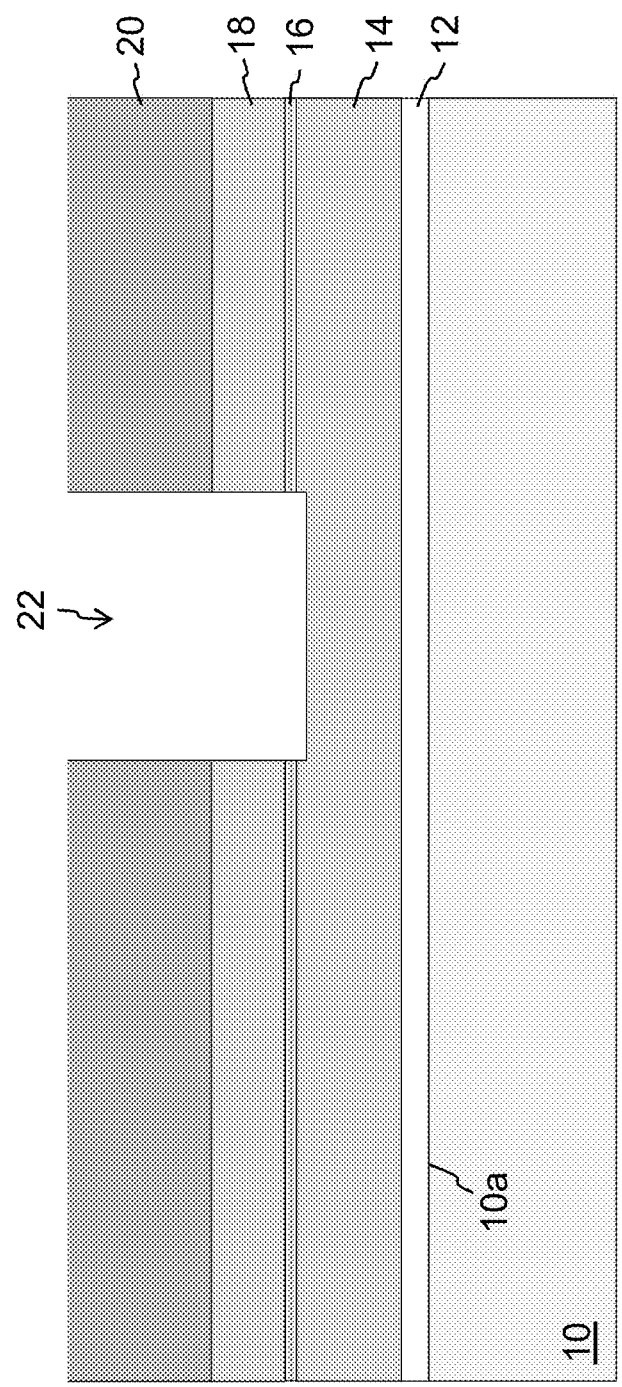
FIGS. 1A-1F are side cross section views showing the steps in forming the 2-bit memory cell of the present invention.

The present invention is a memory cell design, architecture and method of manufacture of a split-gate, 2-bit memory cell. Referring to FIGS. 1A-1F, there are shown cross-sectional views of the steps in the process to make a 2-bit memory cell. While only the formation of a single 2-bit memory cell is shown in the figures, it should be understood that an array of such 2-bit memory cells are formed concurrently when forming a memory device containing an array of such 2-bit memory cells. The process begins by forming a first insulation layer 12 (e.g. layer of silicon dioxide, also referred to herein as oxide layer 12) on the top surface 10a of a substrate 10 of a semiconductor material (e.g., single crystalline silicon. Thereafter, a first conductive layer 14 (e.g. polysilicon (also referred to herein as "poly") or amorphous silicon) is formed on the oxide layer 12. Then a second insulation layer 16 is formed on conductive layer 14. Preferably, second insulation layer 16 is an ONO layer, meaning it has oxide-nitride-oxide sublayers. A second conductive layer 18 (e.g. polysilicon or amorphous silicon) is formed on second insulation layer 16. A third insulation layer 20 (e.g. silicon nitride—referred to herein as "nitride") is formed on second conductive layer 18. Photoresist material (not shown) is coated on the structure, and a photolithography masking step is performed exposing selected portions of the photoresist material. The photoresist is developed such that portions of the photoresist are removed. Using the remaining photoresist as a mask, the structure is etched. Specifically, third insulation layer 20, second conductive layer 18 and second insulation layer 16 are anisotropically etched (using conductive layer 14 as an etch stop), leaving a trench 22 extending through third insulation layer 20, second conductive layer 18 and second insulation layer 16. The resulting structure is shown in FIG. 1A (after photoresist removal).

Figure 1B:
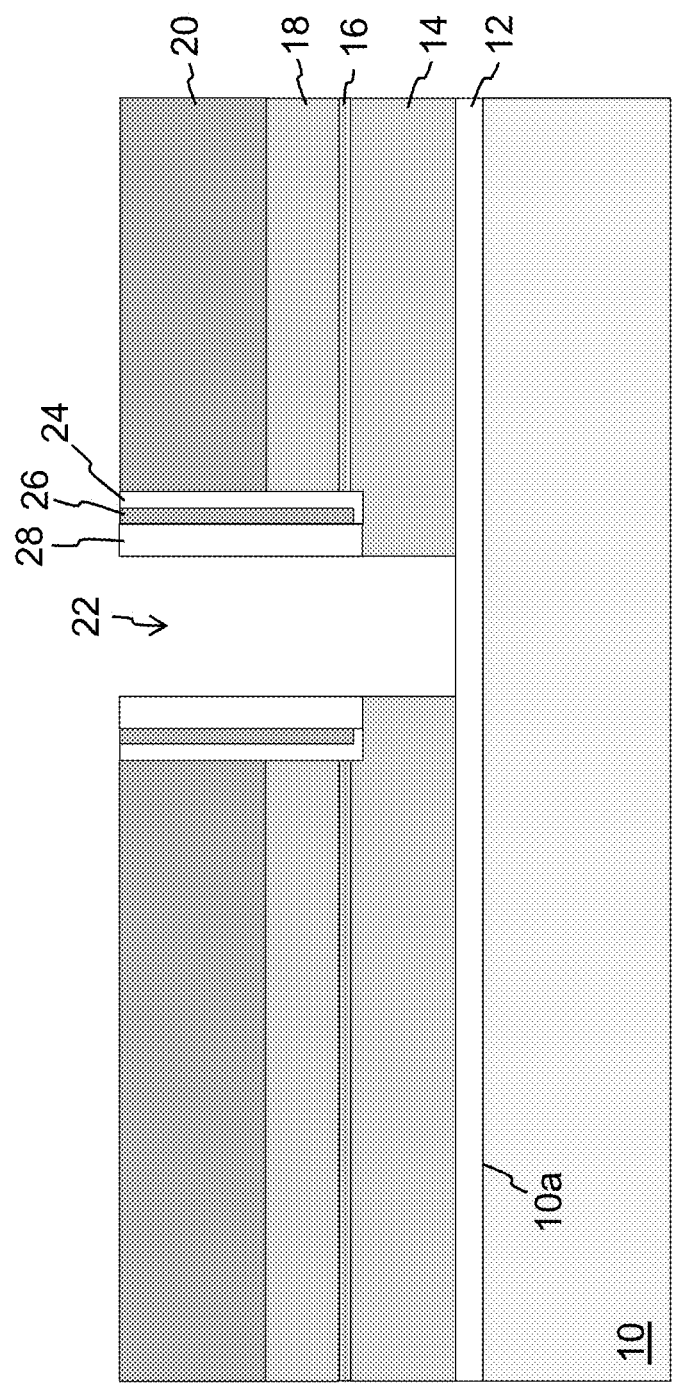

Insulation spacers 24/26 (e.g., ON—oxide and nitride) are formed along the sidewalls of trench 22. Formation of spacers is well known in the art, and involves the deposition of a material over the contour of a structure, followed by an anisotropic etch process, whereby the material is removed from horizontal surfaces of the structure, while the material remains largely intact on vertically oriented surfaces of the structure (with a rounded upper surface, not shown). Insulation (ON) spacers 24/26 are formed by oxide deposition, nitride deposition, and then nitride anisotropic etch and oxide anisotropic etch. Oxide spacers 28 are then formed in trench 22 by oxide deposition followed by oxide anisotropic etch. An anisotropic etch is then performed to remove the exposed portion of conductive layer 14 below the area located between oxide spacers 28, as shown in FIG. 1B, deepening trench 22. An implantation may be performed at this time (through oxide layer 12 at the bottom of trench 22 and into the portion of the substrate 10 underneath (which will eventually be the word line portion of the channel region as described further below).

Figure 1C:
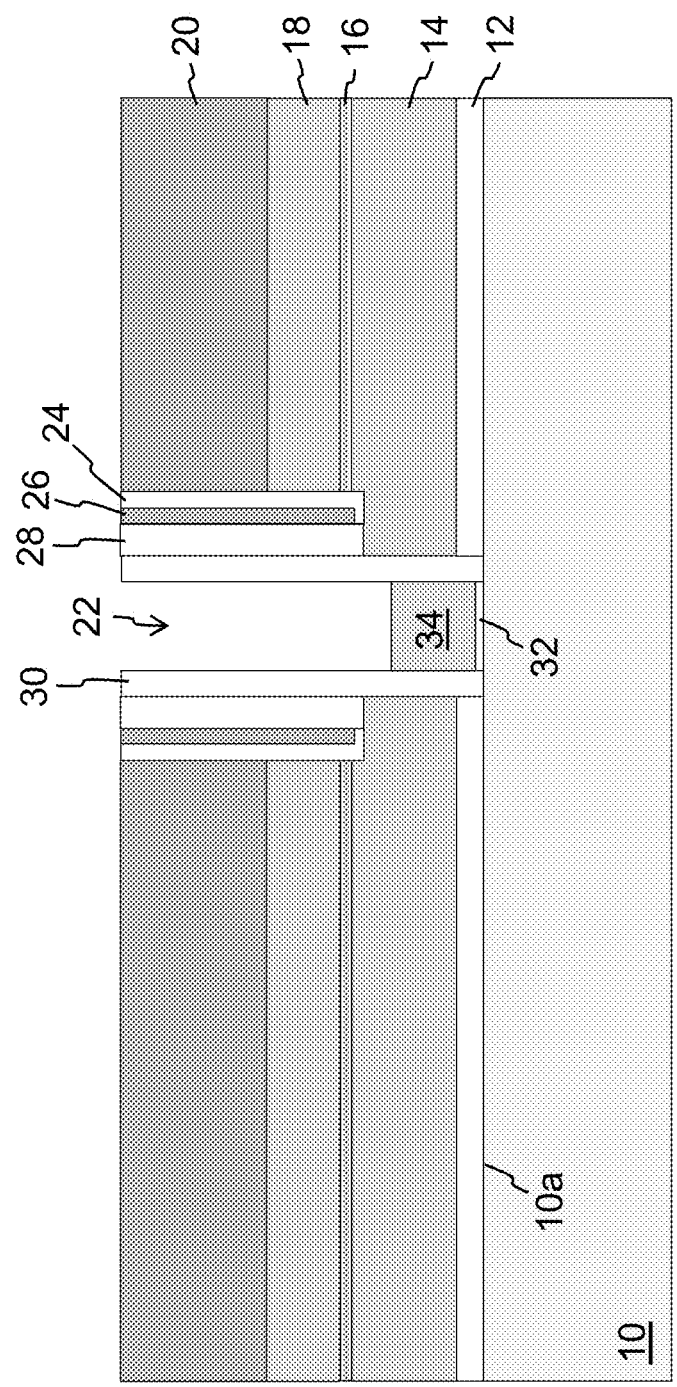

Oxide spacers 30 are next formed along the sidewalls of trench 22 (including along the exposed sidewalls of conductive layer 14) by oxide deposition and anisotropic oxide etch. This spacer formation, particularly the anisotropic oxide etch which removes the portion of oxide layer 12 at the bottom of trench 22, leaves the portion of the substrate surface 10a between oxide spacers 30 exposed. Oxide layer 32 is formed on this exposed portion of the substrate surface 10a at the bottom of trench 22, preferably by thermal oxidation. Also preferably oxide layer 32 has a thickness that is less than that of oxide layer 12. A first block of conductive material 34 is formed on oxide layer 32 inside trench 22 by material deposition, a chemical mechanical polish (CMP) using third insulation layer 20 as a stop layer), and etch back. Preferably, the first block of conductive material 34 is formed of polysilicon, and the top surface of the first block of conductive material 34 is below the top surface of the conductive layer 14. The first block of conductive material 34 is laterally adjacent to, and insulated from, conductive layer 14. An implantation can be performed to dope the first block of conductive material 34 should polysilicon be used for the first block of conductive material 34. The resulting structure is shown in FIG. 1C.

Figure 1D:
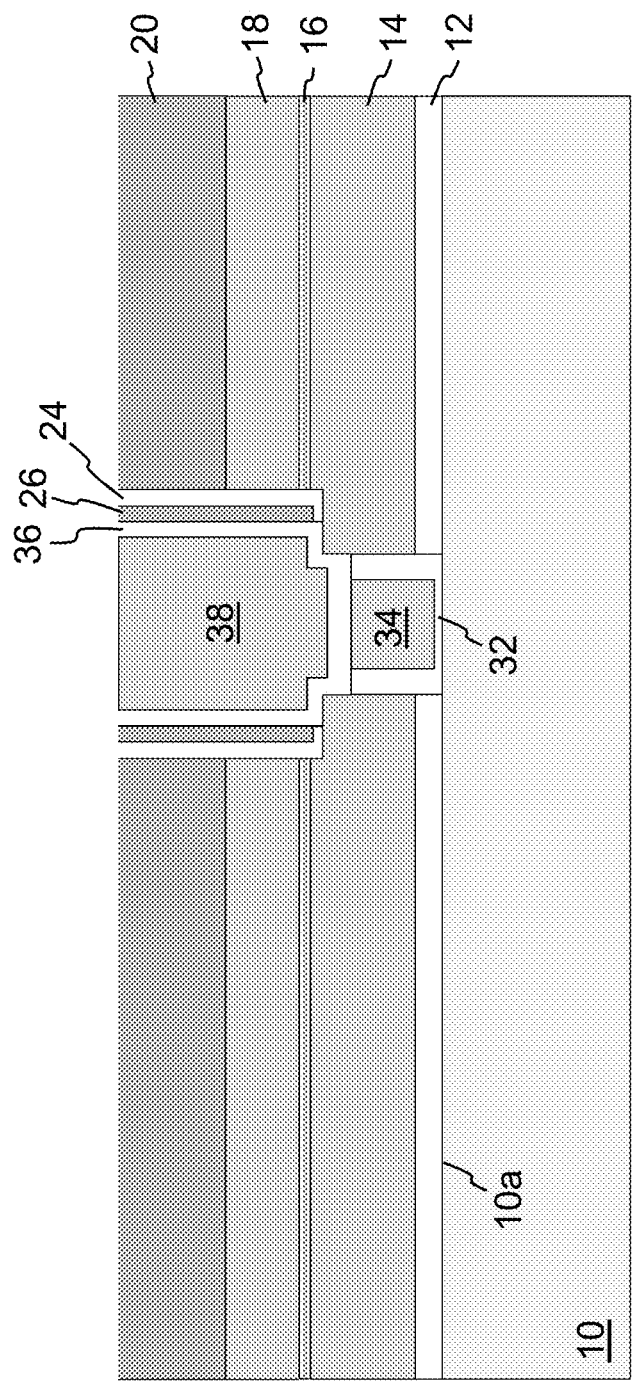

An oxide etch (e.g., wet etch) is used to remove the upper portions of oxide spacers 30 (above the block of conductive material 34) and all of oxide spacers 28. An oxide layer 36 is then formed over the structure by oxide deposition. A second block of conductive material 38 is formed on oxide layer 36 inside trench 22 by material deposition and a chemical mechanical polish (CMP) using third insulation layer 20 as a stop. Preferably, the second block of conductive material 38 is formed of polysilicon. The resulting structure is shown in FIG. 1D.

Figure 1E:
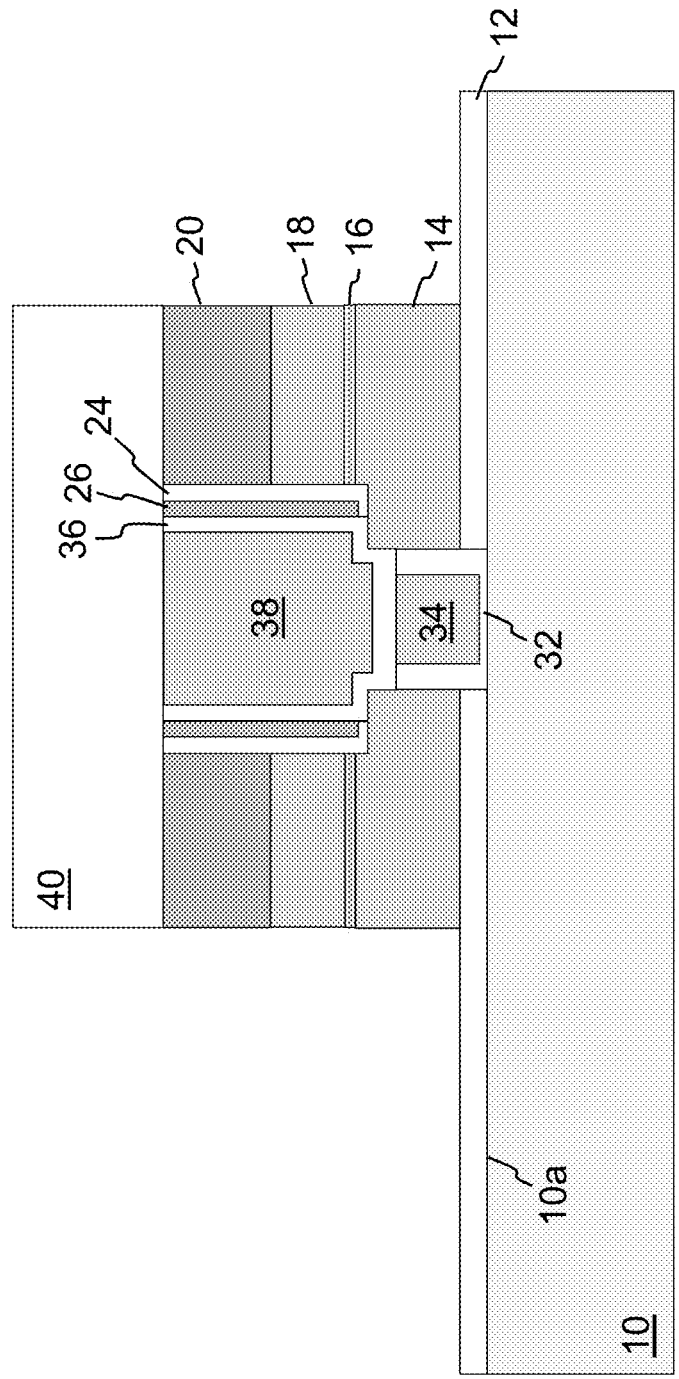
Figure 1F:
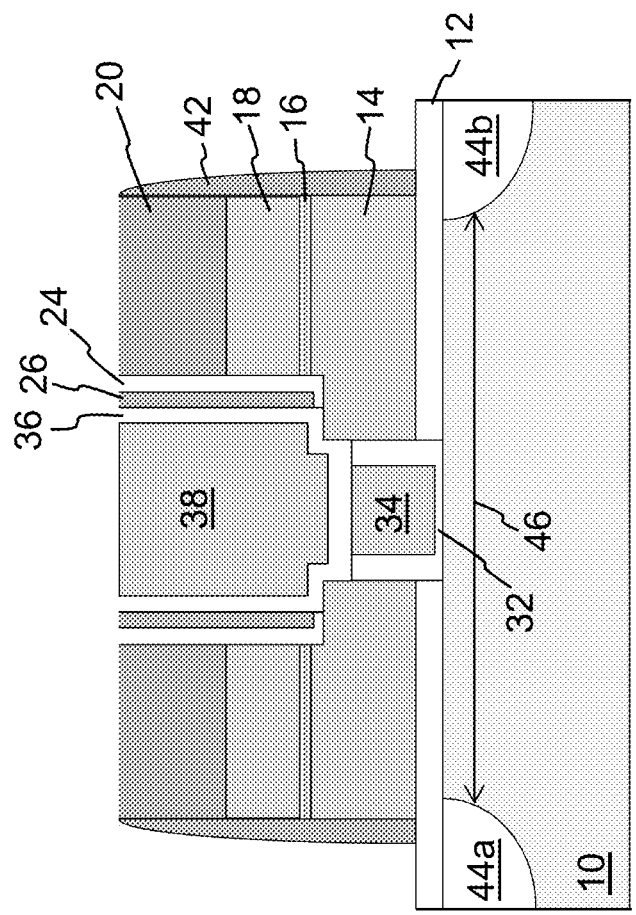

Photoresist material 40 is coated on the structure, and a photolithography masking step is performed exposing selected portions of the photoresist material. The photoresist material 40 is developed such that portions of the photoresist material 40 are removed (except for photoresist material 40 over the second block of conductive material 38 and over portions of third insulation layer 20 adjacent the second block of conductive material 38). Using the remaining photoresist material 40 as a mask, the structure is etched to remove the exposed portions of third insulation layer 20, second conductive layer 18, second insulation layer 16 and conductive layer 14, as shown in FIG. 1E. After photoresist 40 is removed, spacers 42 (e.g., nitride) are formed along the sides of the structure by deposition and anisotropic etch. An implantation is then performed to form drain regions 44a and 44b in the substrate 10 laterally adjacent to the spacers 42, and extending beneath the respective spacers 42 and partially under the respective adjacent conductive layer 14. Drain regions 44a/44b are first and second regions of the substrate having a conductivity type different from that of the substrate 10 in the vicinity of a channel region 46 described below. For example, the channel region 46 can be P type conductivity, and the drain regions 44a/44b can be N type conductivity, and vice-versa. The final structure is shown in FIG. 1F.

Figure 2:
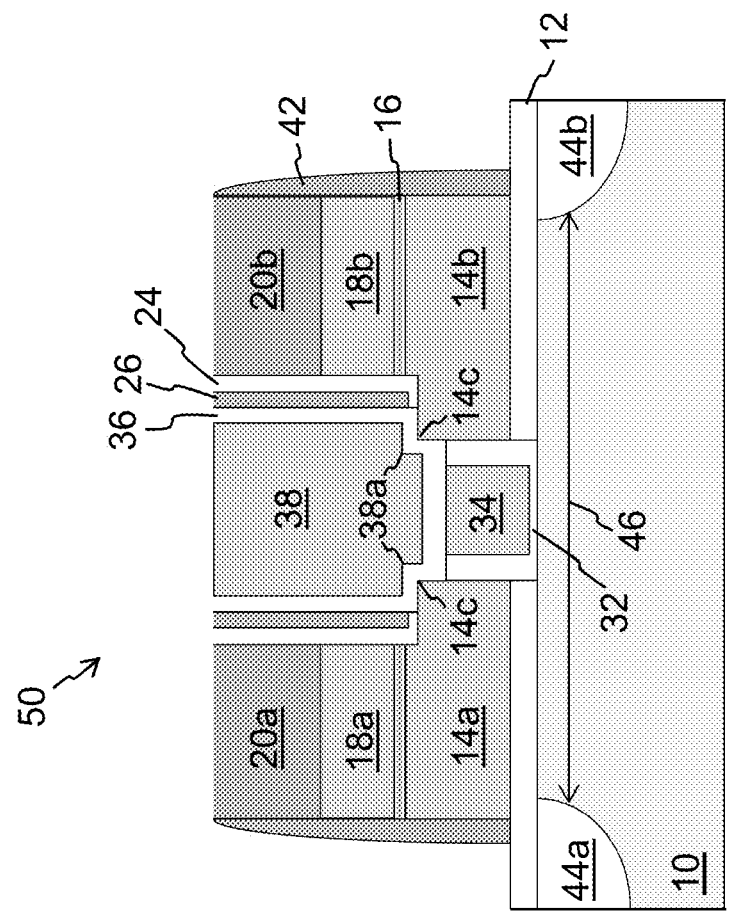
FIG. 2 is a side cross section view showing the final 2-bit memory cell structure of the present invention.

The final 2-bit memory cell 50 is best shown in FIG. 2, where channel region 46, which is continuous, is defined in the substrate 10 by, and extends between, spaced apart first and second drain (bit line) regions 44a and 44b. A first floating gate 14a (a first block of material remaining from conductive layer 14) is disposed over and insulated from a first portion of the channel region 46 (for controlling the conductivity thereof) adjacent the first drain region 44a, and preferably the first floating gate 14a is partially disposed over and insulated from the first drain region 44a, by a respective remaining portion of oxide layer 12. A first coupling gate 18a (first block of material remaining from conductive layer 18) is disposed over and insulated from the first floating gate 14a (for voltage coupling to the floating gate 14a), by a respective remaining portion of second insulation layer 16. A second floating gate 14b (a second block of material remaining from conductive layer 14) is disposed over and insulated from a third portion of the channel region 46 (for controlling the conductivity thereof) adjacent the second drain region 44b, and preferably the second floating gate 14b is partially disposed over and insulated from the second drain region 44b by a respective remaining portion of oxide layer 12. A second coupling gate 18b (second block of material remaining from conductive layer 18) is disposed over and insulated from the second floating gate 14b (for voltage coupling to floating gate 14b) by a respective remaining portion of second insulation layer 16. The first block of conductive material 34 is a word line gate disposed vertically over and insulated from a second portion of the channel region 46 (for controlling the conductivity thereof), and is laterally adjacent to the first and second floating gates 14a/14b. The second block of conductive material 38 is an erase gate that is disposed vertically over and insulated from the word line gate 34, and laterally adjacent to and insulated from the first and second coupling gates 18a/18b, the insulation from the word line gate 34 provided by oxide layer 36 and the insulation from the first and second coupling gate 18a/18b provided by oxide layer 36 and spacer 24/26. The erase gate 38 includes notches 38a each facing a respective edge 14c of one of the first and second floating gates 14a/14b. Insulation blocks 20a and 20b (blocks of material remaining from third insulation layer 20) are disposed over first and second coupling gates 18a/18b.

Table 1 below illustrates exemplary operational voltages and currents for program, read and erase operations of the 2-bit memory cell 50.

TABLE 1

|  | EG 38 | WLG 34 | CG 18a | CG 18b | Drain 44a | Drain 44b |
| --- | --- | --- | --- | --- | --- | --- |
| Program bit 1 | 4.5 V | 1 V | 10.5 V | 4.5 V | 4.5 V | −1uA |
| Program bit 2 | 4.5 V | 1 V | 4.5 V | 10.5 V | −1uA | 4.5 V |
| Read bit 1 | 0 | Vcc | 0 | 4.5 V | 0 | Vblr |
| Read bit 2 | 0 | Vcc | 4.5 V | 0 | Vblr | 0 |
| Erase both bits | 8.5 V | 0 | −7 V | −7 V | 0 | 0 |

Vcc can be, for example, 0.9V~3.3V. Vblr can be, for example, 0.6V~1.1V.

Programming first floating gate 14a with electrons stores the first bit (i.e., bit 1) of information, and programming second floating gate 14b with electrons stores the second bit (i.e., bit 2) of information. To program first floating gate 14a, a voltage of about 4.5V is applied to erase gate 38 and a voltage of about 10.5V is applied to first coupling gate 18a which are capacitively coupled to first floating gate 14a. A voltage of about 1V is applied to the word line gate 34 which turns on the portion of channel region 46 under the word line gate 34. A voltage of about 4.5V is applied to second coupling gate 18b which is capacitively coupled to second floating gate 14b, to turn on the portion of the channel region 46 under the second floating gate 14b. A voltage of about 4.5V is applied to first drain region 44a and a current of about −1 uA is applied to second drain region 44b. Electrons travel from second drain region 44b toward first drain region 44a, and inject themselves onto first floating gate 14a because of the positive voltage capacitively coupled to first floating gate 14a by erase gate 38 and first coupling gate 18a. Second floating gate 14b is similarly programmed using the combination of voltages for bit 2 in Table 1.

To erase the first and second floating gates 14a and 14b, a voltage of about 8.5 volts is applied to the erase gate 38, and a negative voltage of about −7V is applied to the first and second coupling gates 18a and 18b, which causes electrons to tunnel through the insulation layer 36 from the first and second floating gates 14a and 14b to the erase gate 38. Notches 38a facing respective edges 14c enhance the efficiency of this tunneling.

To read first floating gate 14a, Vcc is applied to word line gate 34 which turns on the portion of the channel region 46 under word line gate 34. A voltage of Vblr is applied to second drain region 44b and zero volts is applied to first drain region 44a. A voltage of about 4.5V is applied to second coupling gate 18b, which is capacitively coupled to second floating gate 14b (turning on the portion of channel region 46 under second floating gate 14b). Current will flow through the channel region 46 if first floating gate 14a is erased (i.e., in the erased state first floating gate 14a will have a positive voltage thereon due to positive charge on first floating gate 14a after erasing and a small voltage coupling from word line gate 34, and therefore the portion of the channel region 46 under the first floating gate 14a is turned on). Current is sensed as an erased stated. Current is reduced or will not flow through the channel region 46 if first floating gate 14a is programmed (i.e. is programmed with electrons sufficient to prevent turning on the portion of the channel region under first floating gate 14a). The low or no current is sensed as a programmed state. Second floating gate 14b is similarly read using the combination of voltages for bit 2 in Table 1.

The 2-bit memory cell 50 has many advantages. The insulation (i.e., oxide layer 32) under the word line gate can be much thinner than the insulation (i.e., oxide layer 12) under the first and second floating gates 14a/14b, for higher performance especially for high speed applications. The insulation (i.e., oxide layer 36) between the first and second floating gates 14a/14b and the erase gate 38 can be thinner than the insulation (i.e., oxide spacer 30) between the first and second floating gates 14a/14b and the word line gate 34. The erase performance is enhanced because of the relatively low voltage coupling ratio between the erase gate 38 and the first and second floating gates 14a/14b (because only the corner regions of erase gate 38 (with notches 38a) are in close proximity to the corner regions (with edges 14c) of the first and second floating gates 14a/14b). Only two photolithography masking steps are needed to define the structure, one for forming trench 22, and one for etching through conductive layers 18 and 14 to complete the formation of first and second coupling gates 18a/18b and first and second floating gates 14a/14b. Both word line gate 34 and erase gate 38 are self-aligned to the first and second floating gates 14a/14b.

Figure 3A:
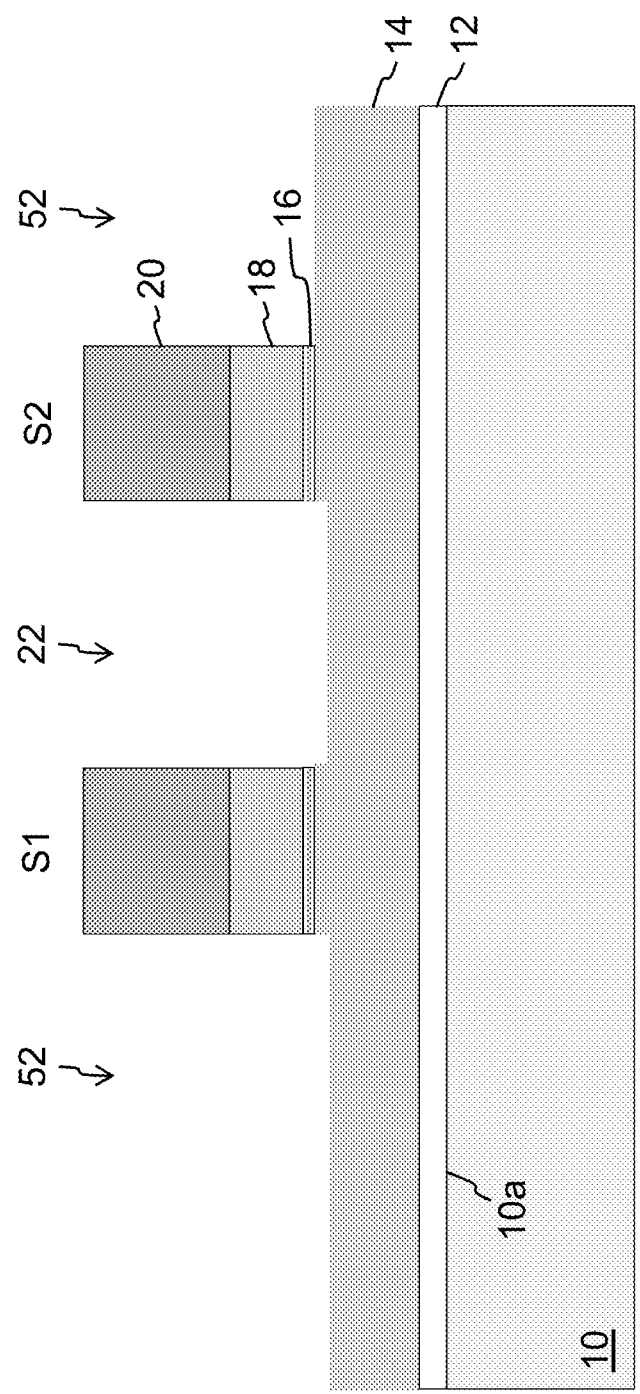
FIGS. 3A-3F are side cross section views showing the steps in forming an alternate embodiment of the 2-bit memory cell of the present invention.
Figure 3B:
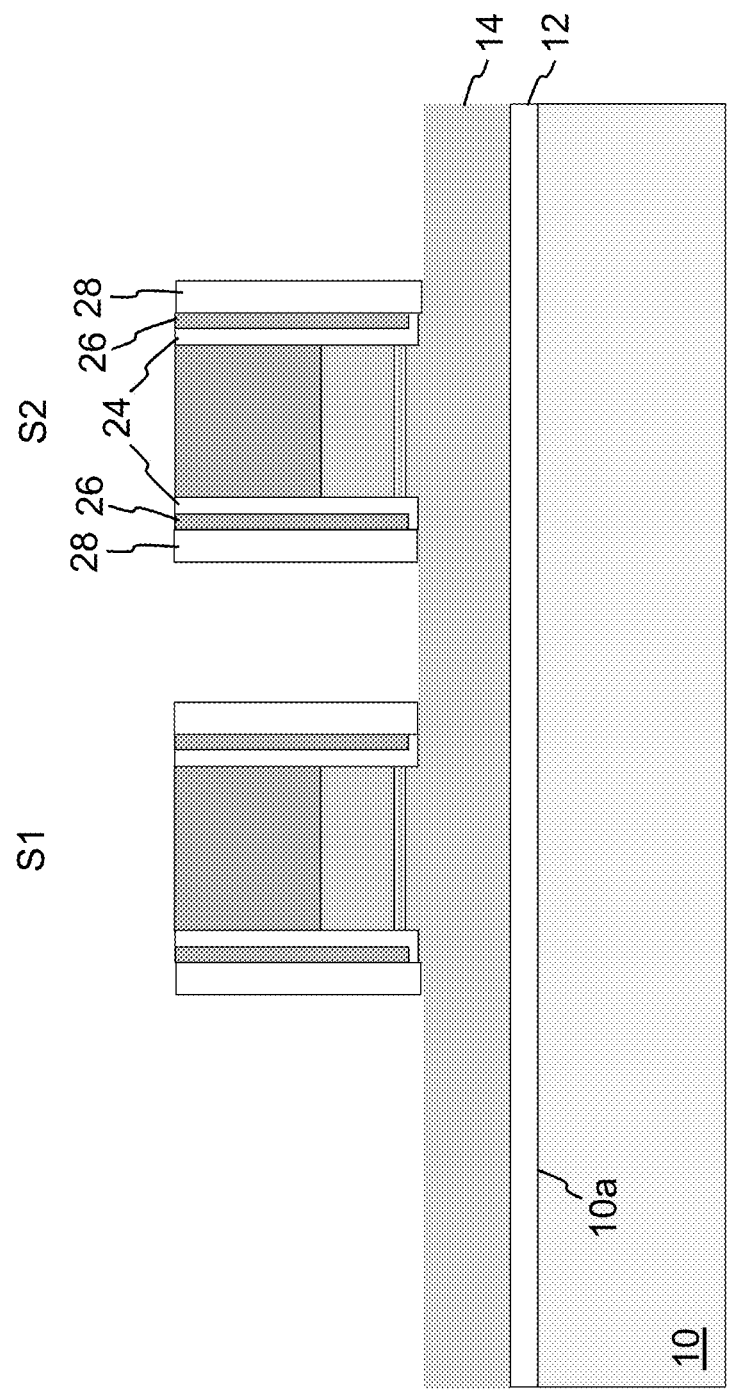
Figure 3C:
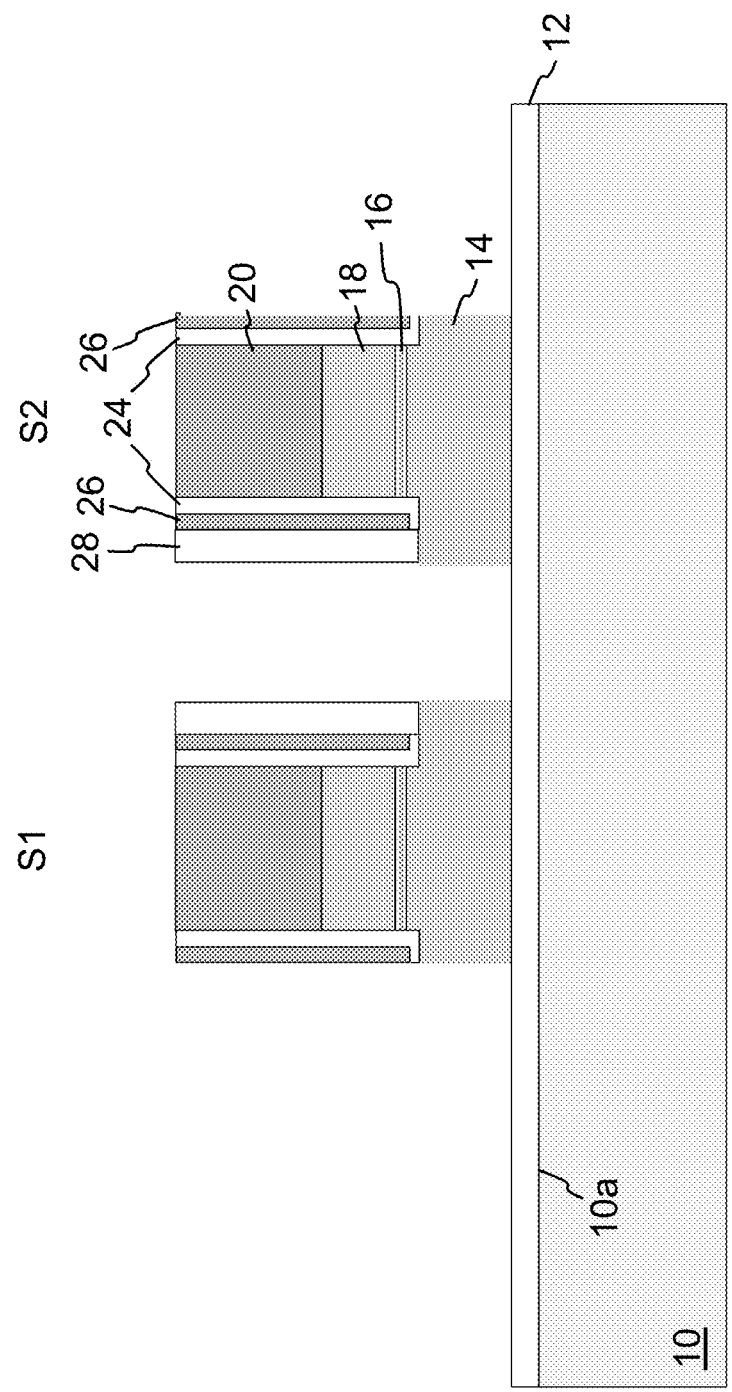

FIGS. 3A-3F illustrate an alternate embodiment for forming the 2-bit memory cell, which starts with the structure similar to that shown in FIG. 1A, except when forming trench 22, additional trenches 52 are formed as well (one on each side of trench 22), as shown in FIG. 3A (after photo resist removal). Forming the two trenches 52 along with trench 22 therebetween results in stack structures S1 and S2, each having a block of the third insulation layer 20 over a block of the second conductive layer 18 over a block of the second insulation layer 16 over conductive layer 14. Oxide spacers 24, nitride spacers 26 and oxide spacers 28 are formed along the sidewalls of stack structures S1 and S2 using the same processing steps as described above with respect to FIG. 1B, resulting in the structure shown in FIG. 3B. A masking step is then used to cover the stack structures S1 and S2 with photoresist except for oxide spacers 28 on the outer facing sidewalls of stack structures S1 and S2. An etch is then used to remove oxide spacers 28 on the outer facing sidewalls of stack structures S1 and S2. After photoresist removal, exposed portions of conductive layer 14 (i.e., those portions not protected by the stack structures S1 and S2) are removed by an etch, resulting in the structure of FIG. 3C. An implantation may be performed at this time (through oxide layer 12 between the stack structures S1 and S2 and into the portion of the substrate 10 underneath (which will eventually be the word line portion of the channel region as described further below).

Figure 3D:
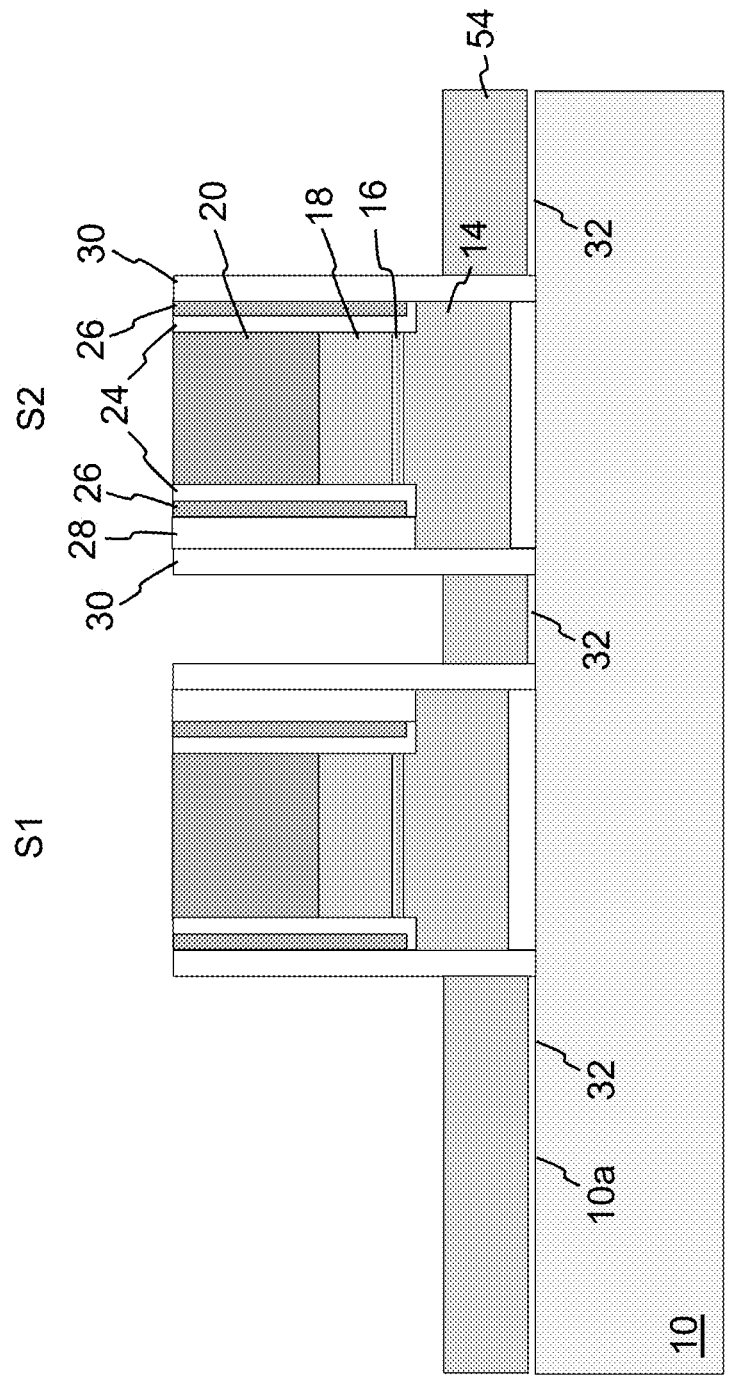

Oxide spacers 30 are next formed along the sidewalls of stack structures S1/S2 (including along the exposed sidewalls of conductive layer 14) by oxide deposition and anisotropic oxide etch. This spacer formation, particularly the anisotropic oxide etch which removes the portion of oxide layer 12 at the bottom of trench 22, removes the exposed portions of oxide layer 12. Oxide layer 32 is formed on the exposed portions of the substrate surface 10a at the bottom of trench 22, preferably by thermal oxidation. Also preferably oxide layer 32 has a thickness that is less than that of oxide layer 12. A conductive layer 54 (e.g. polysilicon or amorphous silicon) is formed on the structure. A CMP is performed on the conductive layer (using third insulation layer 20 as a stop layer). An etch is then used to lower the top surface of conductive layer 54 preferably below the top surface of the conductive layer 14. An implantation can be performed to dope the conductive layer 54 should polysilicon be used for the conductive layer 54. The resulting structure is shown in FIG. 3D.

An oxide etch (e.g., wet etch) is used to remove the upper portions of oxide spacers 30 (above the conductive layer 54) and all of oxide spacers 28. Oxide layer 56 is then formed over the structure by oxide deposition. A conductive layer 58 is formed on oxide layer 56. Preferably, the conductive layer 58 is formed of polysilicon. A chemical mechanical polish (CMP) is then performed using third insulation layer 20 as a stop. The resulting structure is shown in FIG. 3E.

Figure 3E:
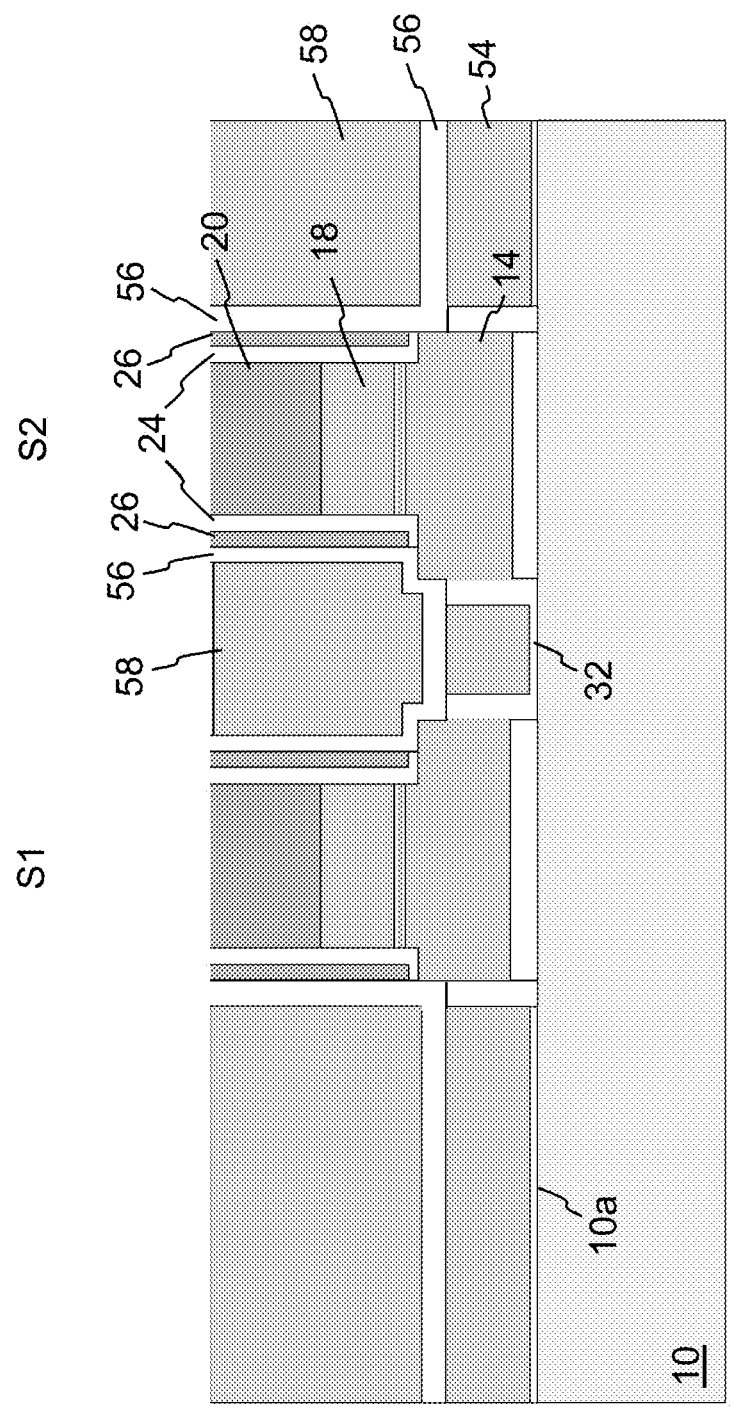
Figure 3F:
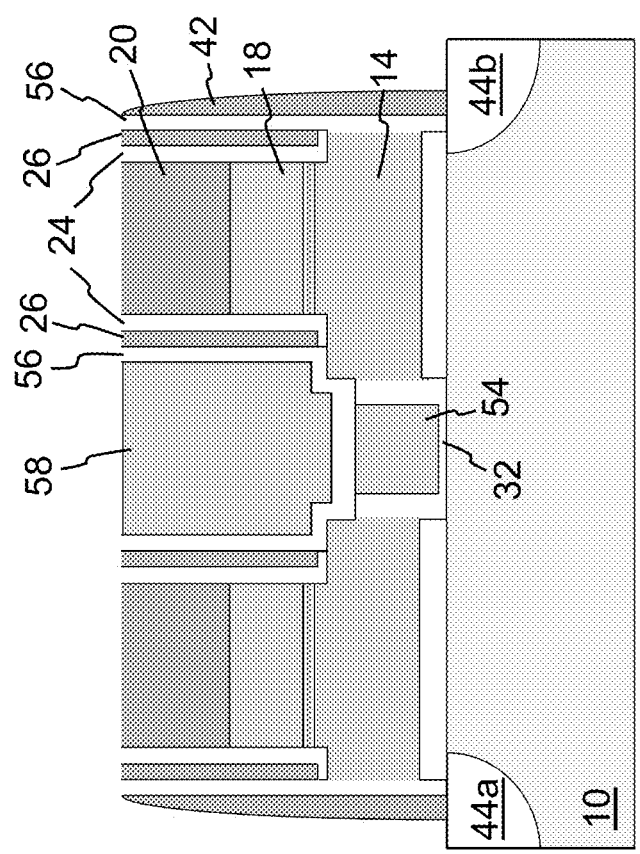

Photoresist material is coated on the structure, exposed, and selectively removed leaving the area above and between the stack structures S1 and S2 covered but the area outside of the stack structures S1 and S2 exposed (i.e., the area to the right of stack structure S2 and the area to the left of stack structure S1 in FIG. 3E). Etches are then performed to remove portions of the conductive layer 58, oxide layer 56 and conductive layer 54, outside of the stack structures S1/S2. After photoresist removal, spacers 42 (e.g., nitride) are formed along the sides of the structure by deposition and anisotropic etch. An implantation is then performed to form first and second drain regions 44a and 44b in the substrate 10 laterally adjacent to the spacers 42, and extending beneath the respective spacers 42 and partially under the respective adjacent conductive layer 14. The final structure is shown in FIG. 3F.

Figure 4:
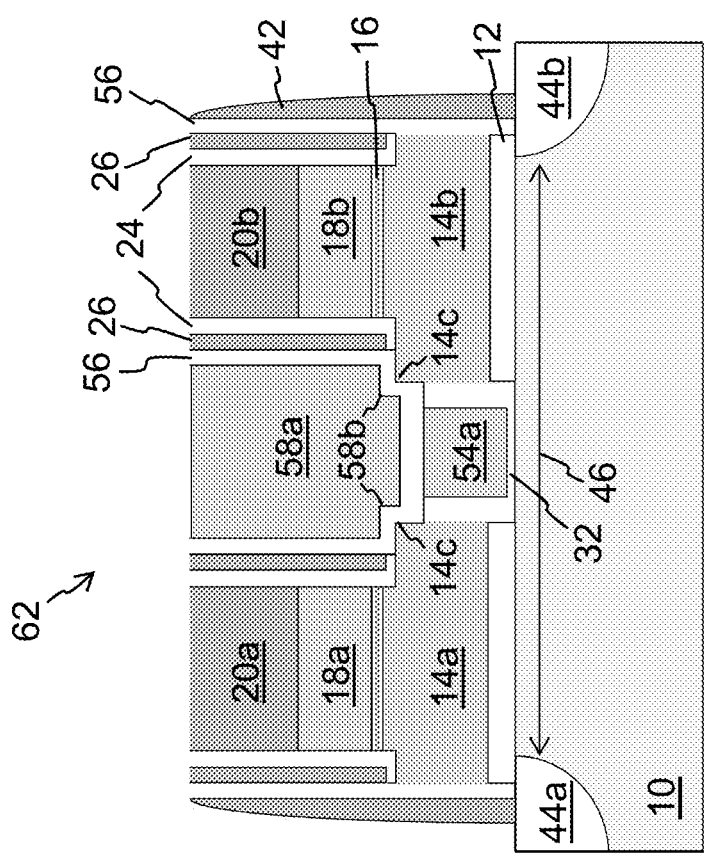
FIG. 4 is a side cross section view showing the final alternate embodiment 2-bit memory cell structure of the present invention.

The final 2-bit memory cell 62 of the alternate embodiment is best shown in FIG. 4, which essentially has the same structure as that shown in FIG. 2, except the erase gate 58a is the remaining portion of conductive layer 58 (with notches 58b facing respective edges 14c of the first and second floating gates 14a/14b), the word line gate 54a is the remaining portion of conductive layer 54, and the tunnel oxide separating erase gate 58a from first and second floating gates 14a/14b is oxide layer 56.

The additional advantages of the alternate embodiment include that the horizontal dimensions of first and second coupling gates 18a/18b are defined by one lithography step, which can reduce dimension variations for the first and second coupling gates 18a/18b.

Figure 5:
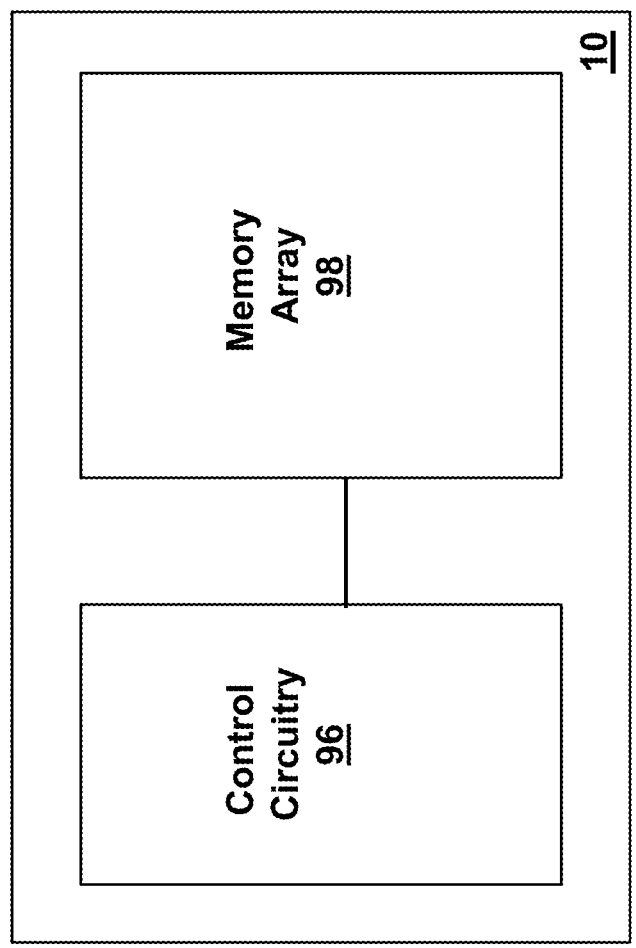
FIG. 5 is a plan view showing control circuitry used to operate an array of 2-bit memory cells of the present invention.

Control circuitry 96 preferably (but not necessarily) formed on the same substrate 10 (as shown in FIG. 5) is configured to program, read and erase a memory array 98 of the 2-bit memory cells 50 or 62 described herein by applying the voltages of Table 1 as described above.

It is to be understood that the present invention is not limited to the embodiment(s) described above and illustrated herein, but encompasses any and all variations falling within the scope of the appended claims. For example, references to the present invention herein are not intended to limit the scope of any claim or claim term, but instead merely make reference to one or more features that may be covered by one or more of the claims. Materials, processes and numerical examples described above are exemplary only, and should not be deemed to limit the claims. Further, as is apparent from the claims and specification, not all method steps need be performed in the exact order illustrated or claimed, but rather in any order that allows the proper formation of the memory cell array of the present invention. Lastly, single layers of material could be formed as multiple layers of such or similar materials, and vice versa.

It should be noted that, as used herein, the terms "over" and "on" both inclusively include "directly on" (no intermediate materials, elements or space disposed there between) and "indirectly on" (intermediate materials, elements or space disposed there between). Likewise, the term "adjacent" includes "directly adjacent" (no intermediate materials, elements or space disposed there between) and "indirectly adjacent" (intermediate materials, elements or space disposed there between), "mounted to" includes "directly mounted to" (no intermediate materials, elements or space disposed there between) and "indirectly mounted to" (intermediate materials, elements or spaced disposed there between), and "electrically coupled" includes "directly electrically coupled to" (no intermediate materials or elements there between that electrically connect the elements together) and "indirectly electrically coupled to" (intermediate materials or elements there between that electrically connect the elements together). For example, forming an element "over a substrate" can include forming the element directly on the substrate with no intermediate materials/elements there between, as well as forming the element indirectly on the substrate with one or more intermediate materials/elements there between.

What is claimed is:

1. A method of forming a memory cell, comprising:
    forming a first insulation layer on a semiconductor substrate having a first conductivity type;
    forming a first conductive layer on the first insulation layer;
    forming a second insulation layer on the first conductive layer;
    forming a second conductive layer on the second insulation layer;
    forming a third insulation layer on the second conductive layer;
    forming a trench that extends through the third insulation layer, the second conductive layer, and the second insulation layer;
    forming insulation spacers along a sidewall of the trench;
    extending the trench through the first conductive layer between the insulation spacers;
    forming a word line gate in the trench, wherein the word line gate is disposed vertically over and insulated from the substrate;
    forming an erase gate in the trench, wherein the erase gate is disposed vertically over and insulated from the word line gate;
    removing portions of the second conductive layer while maintaining first and second portions of the second conductive layer as respective first and second coupling gates, and removing portions of the first conductive layer while maintaining first and second portions of the first conductive layer as respective first and second floating gates; and
    forming first and second regions in the substrate and having a second conductivity type different than the first conductivity type, wherein the first region is adjacent to the first floating gate and the second region is adjacent to the second floating gate, and wherein a continuous channel region in the substrate extends between the first and second regions;
    wherein:
        the first floating gate is disposed over and insulated from the substrate and laterally adjacent to and insulated from the word line gate,
        the second floating gate is disposed over and insulated from the substrate and laterally adjacent to and insulated from the word line gate,
        the first coupling gate is disposed over and insulated from the first floating gate, and
        the second coupling gate is disposed over and insulated from the second floating gate.

2. The method of claim 1, wherein:
    the word line gate is disposed laterally adjacent to and insulated from the first and second floating gates; and
    the erase gate is disposed laterally adjacent to and insulated from the first and second coupling gates.

3. The method of claim 1, wherein before the forming of the erase gate, the method further comprising:
    removing one of the insulation spacers from along the sidewall of the trench.

4. The method of claim 3, wherein the erase gate includes a first notch facing an edge of the first floating gate and a second notch facing an edge of the second floating gate.

5. The method of claim 1, wherein the first floating gate is partially disposed over and insulated from the first region, and the second floating gate is partially disposed over and insulated from the second region.

6. The method of claim 1, wherein insulation between the word line gate and the substrate is thinner than insulation between the first and second floating gates and the substrate.

7. The method of claim 1, wherein insulation between the erase gate and the first and second floating gates is thinner than insulation between the word line gate and the first and second floating gates.

8. A method of forming a memory cell, comprising:
    forming a first insulation layer on a semiconductor substrate having a first conductivity type;
    forming a first conductive layer on the first insulation layer;
    forming a second insulation layer on the first conductive layer;
    forming a second conductive layer on the second insulation layer;
    forming a third insulation layer on the second conductive layer;
    removing portions of the second conductive layer while maintaining first and second portions of the second conductive layer as respective first and second coupling gates, and removing portions of the first conductive layer while maintaining first and second portions of the first conductive layer as respective first and second floating gates;
    forming a word line gate that is disposed vertically over and insulated from the substrate and disposed laterally between the first and second floating gates;
    forming an erase gate that is disposed vertically over and insulated from the word line gate and disposed laterally between the first and second coupling gates; and
    forming first and second regions in the substrate and having a second conductivity type different than the first conductivity type, wherein the first region is adjacent to the first floating gate and the second region is adjacent to the second floating gate, and wherein a continuous channel region in the substrate extends between the first and second regions;
    after the removing of portions of the second conductive layer and before the removing of portions of the first conductive layer, forming insulation spacers along sidewalls of the first coupling gate and along sidewalls of the second coupling gate;
    before the forming of the erase gate, removing one of the insulation spacers from along one of the sidewalls of the first coupling gate and along one of the sidewalls of the second coupling gate;

wherein:
   the first floating gate is disposed over and insulated from the substrate,
   the second floating gate is disposed over and insulated from the substrate,
   the first coupling gate is disposed over and insulated from the first floating gate, and
   the second coupling gate is disposed over and insulated from the second floating gate.

9. The method of claim 8, wherein the erase gate includes a first notch facing an edge of the first floating gate and a second notch facing an edge of the second floating gate.

10. The method of claim 8, wherein:
   the word line gate is disposed laterally adjacent to and insulated from the first and second floating gates; and
   the erase gate is disposed laterally adjacent to and insulated from the first and second coupling gates.

11. The method of claim 8, wherein the first floating gate is partially disposed over and insulated from the first region, and the second floating gate is partially disposed over and insulated from the second region.

12. The method of claim 8, wherein insulation between the word line gate and the substrate is thinner than insulation between the first and second floating gates and the substrate.

13. The method of claim 8, wherein insulation between the erase gate and the first and second floating gates is thinner than insulation between the word line gate and the first and second floating gates.

\* \* \* \* \*